United States Patent
Kirn

(10) Patent No.: US 8,138,827 B2
(45) Date of Patent: *Mar. 20, 2012

(54) FILTER COMPENSATION FOR SWITCHING AMPLIFIERS

(75) Inventor: Larry Kirn, Austin, TX (US)

(73) Assignee: JM Electronics Ltd. LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/105,634

(22) Filed: May 11, 2011

(65) Prior Publication Data

US 2011/0210790 A1    Sep. 1, 2011

Related U.S. Application Data

(63) Continuation of application No. 12/524,841, filed as application No. PCT/US2008/052533 on Jan. 30, 2008, now Pat. No. 7,948,308.

(60) Provisional application No. 60/887,173, filed on Jan. 30, 2007.

(51) Int. Cl.
  *H03F 3/38* (2006.01)
(52) U.S. Cl. .......................................... 330/10
(58) Field of Classification Search ................. 330/10, 330/207 A, 251
  See application file for complete search history.

(56) References Cited

U.S. PATENT DOCUMENTS

| | | | |
|---|---|---|---|
| 6,005,316 A | 12/1999 | Harris | 310/90.5 |
| 6,259,317 B1 | 7/2001 | Melanson | 330/10 |
| 6,492,868 B2 | 12/2002 | Kirn | 330/10 |
| 6,535,058 B1 | 3/2003 | Kirn | 330/10 |
| 6,593,807 B2 | 7/2003 | Groves, Jr. et al. | 330/10 |
| 6,937,090 B2 | 8/2005 | Kirn | 330/10 |
| 7,132,886 B2 | 11/2006 | Kirn | 330/251 |
| 2006/0049869 A1 | 3/2006 | Meng et al. | 330/10 |
| 2010/0066447 A1 | 3/2010 | Kirn | 330/251 |

OTHER PUBLICATIONS

International Search Report for International Application No. PCT/US2008/052533 mailed Jan. 9, 2008.

*Primary Examiner* — Steven J Mottola
(74) *Attorney, Agent, or Firm* — Dorsey & Whitney LLP

(57) ABSTRACT

Embodiments of the present invention provide methods and systems for limiting bipolar current flow in a switching amplifier. Embodiments of the present invention are directed to a multi-referenced switching amplifier. In some embodiment, the switching amplifier is a dual referenced switching amplifier comprising a regulator between the two references, where the first reference provides coarse modulation to a load and the second reference provides fine modulation to the load. The dual referenced switching amplifiers comprise the output filters made up of an inductor and a capacitor. In some embodiments, fine modulation is not applied to the load, thus limiting bipolar current flow induced by the filter inductors.

20 Claims, 3 Drawing Sheets

US 8,138,827 B2

FILTER COMPENSATION FOR SWITCHING AMPLIFIERS

CROSS-REFERENCE TO RELATED APPLICATION(S)

This application is a continuation of U.S. patent application Ser. No. 12/524,841, filed Jul. 28, 2009, U.S. Pat. No. 7,948,308, which application claims priority to International Application No. PCT/US2008/052533 filed Jan. 30, 2008, which claims priority to U.S. Provisional Application No. 60/887,173, filed Jan. 30, 2007. The entire disclosure of these prior applications are considered to be part of the disclosure of the instant application and are hereby incorporated by reference therein.

TECHNICAL FIELD

This invention is directed to amplifiers, and more particularly to switching amplifiers.

BACKGROUND OF THE INVENTION

Switching amplifiers enjoy significantly better efficiency than their non-switching predecessors. However, significant improvements are continuously being made to switching amplifiers to improve fidelity. One recent improvement is the use of multiple references which are selectively switched to a load, often called multi-reference switching amplifiers. Such a circuit configuration is described in U.S. Pat. No. 6,535,058 Multi-reference, High-Accuracy Switching Amplifier, the entire content of which is incorporated herein by reference. Multi-reference switching amplifiers typically comprise an additional regulator than conventional class D switching amplifiers.

A current problem with switching amplifiers involves radio frequency (RF) interference. In order to minimize (RF) interference to surrounding receptors passive output filters using inductors and capacitors are commonly employed after the output stages of multi-reference switching amplifiers. The inductance presented by these filters requires that the regulator control bipolar current at unexpected voltages. This bipolar current requirement is induced by the inductance of the output filters, which places large demands on the regulators used in multi-reference amplifiers, potentially negating the efficiency benefits normally expected from switching amplifiers. In addition, regulators that are capable of both sinking and sourcing current are much more expensive. It would be preferred to use less expensive regulators, which are capable of allowing current to flow in one direction rather than two.

Therefore, a need exists for a method and system where reference regulators of multi-reference switching amplifiers are protected from the bipolar current flow induced by filter inductance.

SUMMARY OF THE INVENTION

The present invention is directed to a system and method of limiting bipolar current flow in a switching amplifier. In one aspect of the invention, a switching amplifier comprising a first voltage source and a second voltage source, the second voltage source being supplied by a regulator. In addition, a first set of switching devices coupled to the first voltage source, and a second set of switching devices coupled to the second voltage source. A controller is configured to control the switching devices to provide modulated pulsewidths to a load, the controller preventing at least one of the second set of switching devices from being coupled to the load when coupling to the load would be expected to cause the regulator to source current.

DETAILED DESCRIPTION OF PREFERRED EMBODIMENTS

Embodiments of the present invention are directed toward providing a system and method of limiting bipolar current flow in a switching amplifier. Certain details are set forth below to provide a sufficient understanding of the invention. However, it will be clear to one skilled in the art that the invention may be practiced without these particular details.

Figure 1:
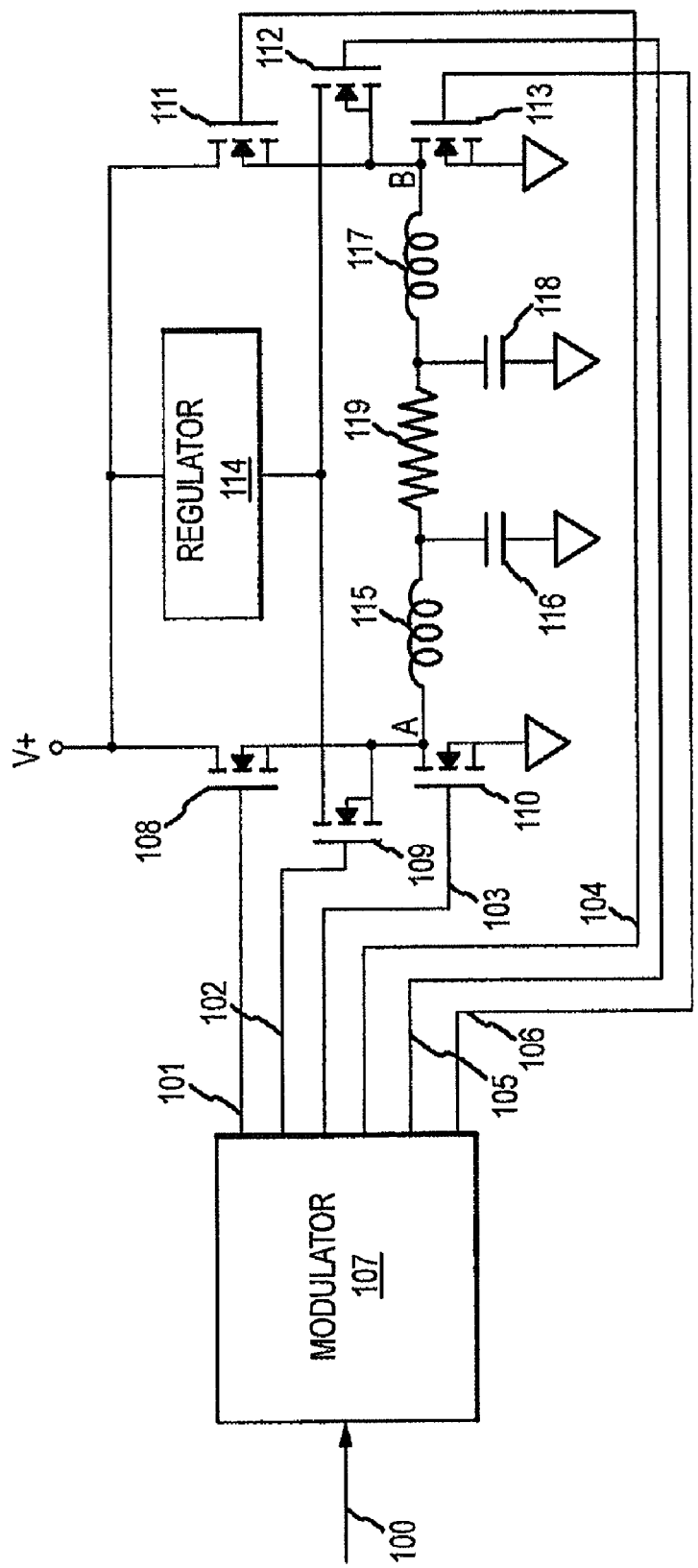
FIG. 1 is a block diagram of a multi-reference switching amplifier using a single regulated secondary reference level according to one embodiment of the invention.

FIG. 1 is a block diagram of a dual reference switching amplifier according to one embodiment of the invention. Although FIG. 1 is directed to a dual reference switching amplifier, a person of ordinary skill in the art would appreciate that the invention applies to any multi-reference switching amplifier. The dual reference switching amplifier of FIG. 1 has two references, positive power supply voltage V+ and the voltage supplied from V+ by a regulator 114. Positive power supply voltage V+ supplies energy to a load 119 through control switches 108, 111. The regulator 114 supplies energy to the load 119 through switches 109, 112. Ground is provided to the load 119 through switching devices 110, 113. In some embodiments, the voltage supplied by the V+ reference is significantly greater than the voltage supplied by the regulator 114. For instance, in one embodiment, the voltage supplied by the positive power supply voltage V+ reference is approximately 12V, and the voltage supplied by the regulator 114 is 47 mV.

Input datastream 100 is applied as input to pulsewidth modulator (PWM) 107, which outputs PWM control signals 101, 102, 103, 104, 105, and 106 to control switching devices 108, 109, 110, 111, 112, and 113, respectively. The load 119 is connected in a bridge configuration across two independent output stages. A first output stage A is through switching devices 108, 109, and 110. A second output stage B is through switching devices 111, 112, and 113. The first output stage A is coupled to an inductor 115, which is further coupled to a capacitor 116. The inductor 115, in conjunction with the capacitor 116, filters the outputs of switching devices 108, 109, and 110 before applying the outputs to a first terminal of the load 119. The second output stage B is coupled to an inductor 117, which is further coupled to a capacitor 118. The inductor 117, in conjunction with the capacitor 118, filters the outputs of switching devices 111, 112, and 113 before applying the outputs to a second terminal of the load 119. Therefore, switching devices 108 and 111 provide gate connection of inductors 115 and 117, respectively, to the positive power supply V+, switching devices 109 and 112 provide gate connection of inductors 115 and 117, respectively, to the reference voltage supplied from V+ by regulator 114, and switching devices 110 and 113 provide gate connection of inductors 115 and 117, respectively, to ground. The circuit of FIG. 1 is described in further detail in U.S. Pat. No. 6,535,058 referenced above.

The circuit of FIG. 1 results in two separate PWM datastreams on each side of the load 119. In one embodiment, the PWM datastream that is applied to the load 119 through switching devices 108, 111 is a coarse high voltage modulated stream. The pulse width modulated datastream that is applied to the load 119 through switching devices 109, 112 is a fine low voltage modulated stream. However, as will be apparent to a person of ordinary skill in the art, the configuration of the coarse and fine voltage stream is dependent upon which switching devices are coupled to the high voltage source and the low voltage source.

Figure 2:
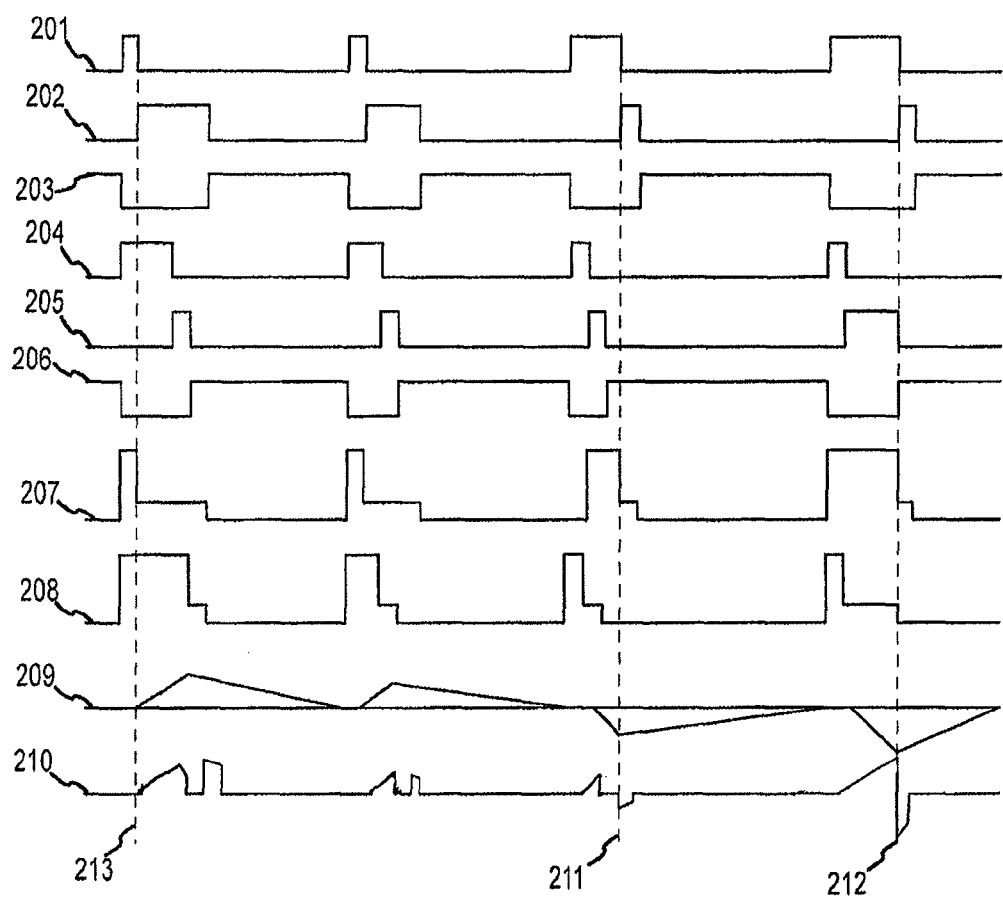
FIG. 2 shows the output voltage and current waveforms typically seen in the amplifier of FIG. 1 in accordance with prior art.

FIG. 2 shows the output voltage and current waveforms typically seen in the amplifier of FIG. 1 in accordance with prior art. Voltage traces 201, 202, 203, 204, 205, and 206 reflect the states of control signals 101, 102, 103, 104, 105, and 106 of FIG. 1, respectively, as the output polarity to the load 119 in FIG. 1 changes. Voltage trace 207 shows the collective outputs of switching devices 108, 109, and 110, as input to inductor 115 at first input stage A. Voltage trace 208 shows the collective outputs of switching devices 111, 112, 113, as input to inductor 117 at second input stage B. As is commonly done with switching amplifiers, the modulation of the datastreams through switching devices 108, 111, which can be seen in voltage traces 201 and 204, and the modulation of the datastreams through switching devices 109, 112, which can be seen in voltage traces 202 and 205, are additive to a minimum pulsewidth. In order to avoid offsets imposed by unbalanced pulsewidths, equal minimum pulsewidths are typically provided on both sides of the output bridge. Thus, often requiring the regulator to both source and sink current.

Current trace 209 indicates signed current in the load 119. Current trace 210 indicates resultant signed output current required of the regulator 114. Current trace 209 indicates signed current in the load 119, with the positive y-axis movement indicating current sinking on the A side of the load 119. Current trace 210 indicates resultant signed output current required of the regulator 114, with the positive y-axis indicating current sinking. In reference to time marker 212, coarse modulated pulsewidths are no longer being applied to the A side of the load 119, and fine modulated pulsewidths are no longer being applied to the B side of the load. However, a reference voltage minimum pulsewidth are applied to the A side of the load. The minimum pulsewidth a mechanism whereby the effects of charge injection of output switching devices is mitigated as taught in U.S. Pat. No. 6,937,090, which is incorporated herein by reference. Also note, V+ minimum pulsewidth is applied to the A side of the load just before timemarker 213.

In particular, the pulses in trace 210 indicate whether the regulator is sourcing or sinking current. Note that current trace 210 shows unipolar current until time marker 211. During this time the regulator 114 is sinking current as indicated by the positive pulses. For instance, before time marker 211, at the first output stage A, the voltage being applied to the inductor 115 is V+, and at the second output stage B, the voltage being applied to the load is also V+. This does not produce a current in the load 119. A moment later, the voltage at the second output stage B reduces from V+ to the regulated reference voltage while the first output stage A remains at the V+ voltage. At that instance, the inductor 117 is expecting a large voltage, but receives a lower voltage. The load 119 has a high current, and the inductor 117 pulls current from the load 119, thus, causing the regulator 114 to sink current.

At time marker 211, the activation of switching device 112 followed by the activation of switching device 109, causes current reversal at the output of regulator 114. As stated above, just before marker 211 a V+ voltage is being applied to the first output stage A and no voltage is being applied to the second output stage B. At the moment of marker 211, the voltage applied to the first output stage A goes from a V+ voltage to the reference voltage and the voltage applied to the second output stage B is ground. However, the inductor 115 is expecting a V+ voltage. Because there is high current in the load 119, the inductor 117 pulls current from the load 119 and tries to pull more current from switching device 109. This results in the regulator 114 sourcing current. The same phenomenon occurs at time marker 212, with a larger current change resultant of a higher output current in the load 119. As can be seen, large unpredictable current swings through zero must be supported by the reference regulator, which requires a more expensive regulator and typically results in distortion.

Turning now to time marker 213. Time marker 213 does not cause the regulator 114 to source current. Just before time marker 213, a V+ voltage is applied to the first output stage A, and the reference voltage is applied to the second output stage B. At time marker 213 the voltage at the input of the inductor 115 reduces from V+ to the reference voltage, and the voltage at the input of the inductor 117 remains at the reference voltage. This does not require the regulator to source current to the load 119. Rather, it forms a shunt. In particular, the reference voltage on each side of the load 119 creates a short circuit across the inductors 115 and 117, and inductors 115 and 117 are able to pull current from each other, rather than source current from the regulator 114.

Figure 3:
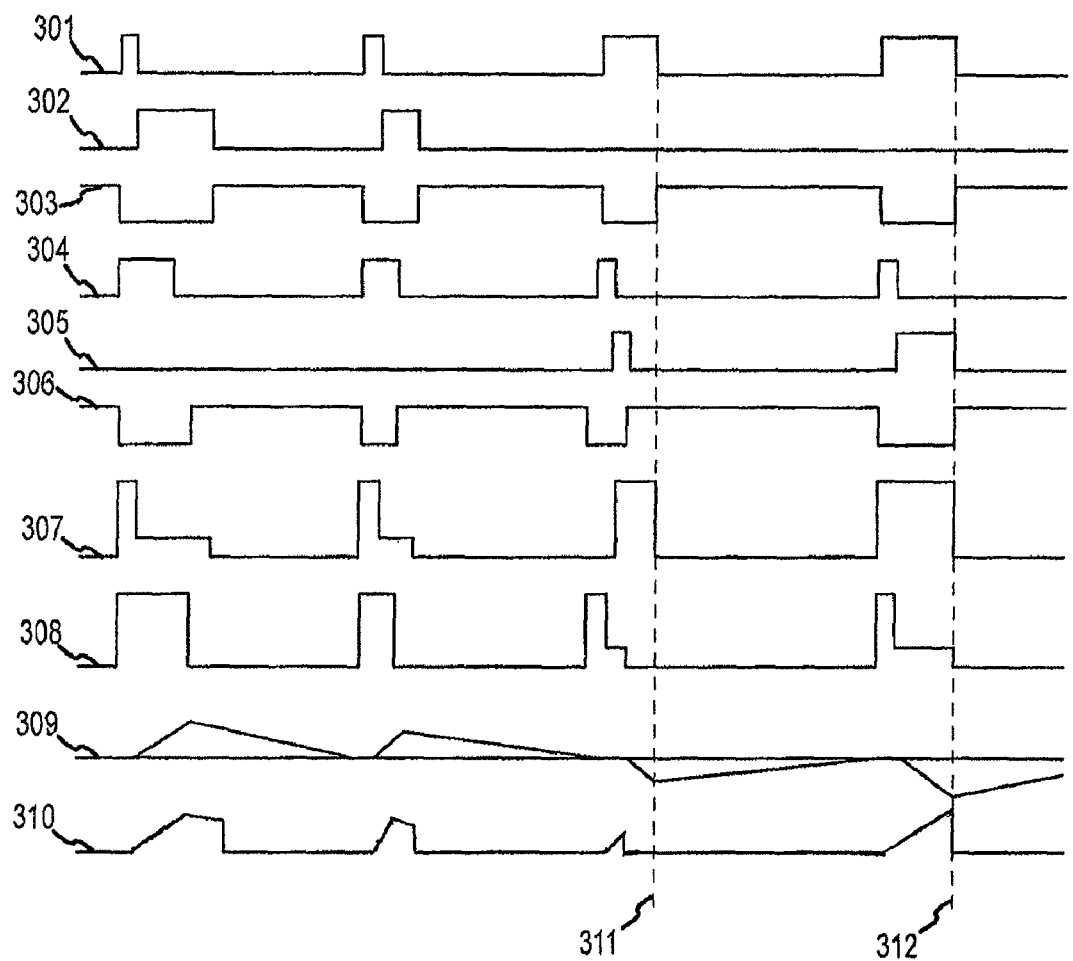
FIG. 3 shows the output voltage and current waveforms of the amplifier of FIG. 1 according to one embodiment of the invention.

FIG. 3 shows the output voltage and current waveforms of the switching amplifier of FIG. 1 according to one embodiment of the invention. Voltage traces 301, 302, 303, 304, 305, and 306 reflect the states of control signals 101, 102, 103, 104, 105, and 106 of FIG. 1, respectively, as the output polarity to the load 119 changes in the same fashion as in FIG. 2. Voltage traces 307 and 308 indicate resultant inputs to inductors 115 and 117, respectively. Current trace 309 indicates signed current in the load 119. Current trace 310 indicates resultant signed output current required of the regulator 114.

In comparison with FIG. 2, note that current trace 310 of FIG. 3 shows unipolar current at both timemarkers 311 and 312, thus indicating that the regulator is only sinking current and not sourcing current. In particular, note the absence of minimum pulsewidths in trace 302 when the pulsewidth of trace 301 exceeds that of trace 304. The wide pulsewidth of trace 301 creates a positive voltage at the first output stage A. In particular, the modulator 107 applies coarse modulation to the load 119 through switching device 108 and does not apply minimum pulsewidths to the load 119 through switching device 109. However, on the other side of the bridge, the modulator 107 applies minimum pulse widths through switching device 111 and fine modulation to the load 119 through switching device 112. Not applying minimum pulsewidths to the first output stage A prevents the regulator 114 from having to source current to the load 119.

Similarly, note the absence of minimum pulsewidths in trace 305 when the pulsewidth of trace 304 exceeds that of trace 301. Although, it is not necessary to prevent the secondary reference pulsewidths in this situation as discussed above in reference to FIG. 2 and time marker 213, it may be done to simplify the algorithm in the controller which produces the pulsewidths, such as in the modulator 107.

In summary, the absence of minimum pulsewidth in traces 302 and 305 prevents the regulator 114 from having to source current. Although the method described above comprises a regulator that is operable to sink current rather than source current, it will be apparent to a person of ordinary skill in the art that the regulator may be operable to source current rather than sink current based on the voltage configuration of the switching amplifier. Therefore, the regulator 114 is generally the type that is operable to allow high current to flow in one direction and not in the other.

As will be apparent to a person of ordinary skill in the art, the voltage configuration in FIG. 1 may be of another configuration. For instance, in one embodiment, the V+ power supply may be ground and the ground shown in FIG. 1 may be a negative voltage. This will require a regulator 114 that is operable to sink current but not operable to source current as the embodiment disclosed in FIG. 1. Another embodiment, however, may include V+ in FIG. 1 as a negative voltage. This would result in the regulator 114 being operable to source current rather than sink current. Similarly, if V+ was ground and the current ground shown in FIG. 1 is a positive voltage, that would also result in a regulator that is operable to source current and not sink current. Therefore, the regulator 114 is generally the type that is operable to allow current to follow in one direction and not in the other. Therefore, the regulator 114 may be operable to sink or source current depending on the configuration of the voltage in the switching amplifier.

As will be apparent to a person of ordinary skill in the art, the modulator 107 determines whether to apply the reference pulsewidth to prevent the regulator 114 from sourcing current. However, an upstream processor or preprocessor may be used to determine whether to apply the reference pulsewidth to prevent the regulator 114 from sourcing current based on the history of the audio input signal. In particular, an upstream controller operable to predict inductor current, further reducing distortion.

Although secondary to the content of the present invention, the output offsets induced by the removal of the reference voltage through the switching devices 109 and 112 are assumed to be removed by compensatory offsets in the modulator. Therefore, even though the removal of the secondary pulsewidth result in a voltage imbalance across the load, it reduces distortion and removes large strains placed on the regulator 114. Thus, it can be seen that sign-gated application of secondary reference pulsewidths eases reference regulation in multi-reference amplifiers considerably.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A switching amplifier, comprising:
 a circuit configured to receive a first voltage and generate a second voltage based, at least in part, on the first voltage;
 a controller configured to generate first and second control signals;
 a first switching circuit configured to generate first pulsewidths based on the first voltage in accordance with the first control signal; and
 a second switching circuit configured to generate second pulsewidths based on the second voltage in accordance with the second control signal;
 wherein the controller is further configured to generate the first and second control signals to prevent the circuit from sourcing current.

2. The switching amplifier of claim 1, wherein the circuit comprises a voltage regulator.

3. The switching amplifier of claim 1, wherein the controller is coupled to the first switching circuit, and wherein the controller is further configured to provide the first control signal to the first switching circuit.

4. The switching amplifier of claim 1, wherein the first switching circuit is further configured to provide the first pulsewidths to a load, and wherein the second switching circuit is further configured to provide the second pulsewidths to the load.

5. The switching amplifier of claim 1, wherein the first switching circuit comprises a plurality of switching devices.

6. The switching amplifier of claim 5, wherein the second switching circuit comprises another plurality of switching devices.

7. The switching amplifier of claim 1, wherein the first switching circuit is further configured to provide coarse control of power to a load, and wherein the second switching circuit is further configured to provide fine control of power to the load.

8. The switching amplifier of claim 1, wherein the controller is further configured to suppress minimum pulsewidths of the second voltage on one side of a load.

9. A switching amplifier, comprising:
 a first switching circuit configured to provide a first voltage to a load;
 a second switching circuit configured to provide a second voltage to the load, wherein the second voltage is generated by circuit based, at least in part, on the first voltage; and
 a modulator configured to provide control signals to the first and second switching circuits such that the first switching circuit is further configured to provide a coarse control of power to the load and the second switching circuit is further configured to provide a fine control of power to the load, wherein the modulator is further configured to control the second switching circuit and thereby prevent the circuit from providing current flow in two directions.

10. The switching amplifier of claim 9, wherein the circuit is a regulator circuit.

11. The switching amplifier of claim 9, wherein the first switching circuit comprises a first plurality of transistors and the second switching circuit comprises a second plurality of transistors.

12. The switching amplifier of claim 9, wherein the modulator is configured to prevent the second switching circuit from providing the second voltage to the load when providing the second voltage to the load would cause the circuit to provide current flow in two directions.

13. The switching amplifier of claim 9, wherein the modulator is configured to suppress minimum pulsewidths of the second voltage on one side of the load.

14. The switching amplifier of claim 9, wherein the second voltage is lower than the first voltage.

15. A method of applying a signal to a load, the method comprising:
 receiving, at a circuit, a first voltage;
 generating, using the circuit, a second voltage based, at least in part, on the received first voltage;
 coupling a first side of the load to the first voltage in accordance with a first control signal to provide coarse control of power to the load;
 coupling a second side of the load to the second voltage in accordance with a second control signal to provide fine control of power to the load, wherein the second control signal further prevents said coupling a second side of the load to the second voltage when coupling the second side of the load to the second voltage would cause the circuit to source current.

16. The method of claim 15, wherein said coupling a first side of the load to the first voltage comprises coupling the first side of the load to the first voltage using a first switching circuit.

17. The method of claim 16, wherein said coupling a second side of the load to the second voltage comprises coupling the second side of the load to the second voltage using a second switching circuit.

18. The method of claim 15, wherein the circuit comprises a regulator.

19. The method of claim 15, wherein the first and second control signals comprise pulsewidth-modulated signals.

20. The method of claim 15, wherein the second control signal further prevents minimum pulsewidths of the second voltage from being applied to the load when minimum pulsewidths of the second voltage would cause the circuit to source current.

* * * * *